United States Patent
Lockyear

(10) Patent No.: US 6,336,206 B1
(45) Date of Patent: Jan. 1, 2002

(54) METHOD AND APPARATUS FOR STRUCTURAL INPUT/OUTPUT MATCHING FOR DESIGN VERIFICATION

(75) Inventor: Brian Lockyear, Beaverton, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/406,861

(22) Filed: Sep. 27, 1999

(51) Int. Cl.[7] .............................................. G06F 17/50
(52) U.S. Cl. ........................ 716/7; 716/2; 716/5; 716/3; 716/18; 703/15
(58) Field of Search ..................... 716/1–21; 703/14–16

(56) References Cited

U.S. PATENT DOCUMENTS

| | | | |
|---|---|---|---|
| 5,469,367 A | * 11/1995 | Puri et al. ...................... | 716/18 |
| 5,493,504 A | * 2/1996 | Minato ........................... | 716/2 |
| 5,519,627 A | * 5/1996 | Mahmood et al. ............ | 716/18 |
| 5,638,381 A | 6/1997 | Cho et al. | |
| 5,748,486 A | * 5/1998 | Ashar et al. ................... | 716/18 |
| 5,926,632 A | * 7/1999 | Kawaguchi .................... | 716/7 |
| 5,991,524 A | * 11/1999 | Belkhale et al. .............. | 716/18 |
| 6,023,566 A | * 2/2000 | Belkhale et al. ............... | 716/2 |
| 6,026,222 A | * 2/2000 | Gupta et al. ................... | 716/5 |
| 6,148,433 A | * 11/2000 | Chowdhary et al. ........... | 716/1 |
| 6,148,436 A | * 11/2000 | Wohl ............................. | 716/18 |
| 6,163,876 A | * 12/2000 | Ashar et al. ................... | 716/5 |

OTHER PUBLICATIONS

NN920529, "Functional Comparisons of Logic Designs", IBM Technical Disclosure Bulletin, vol. 34, No. 12, pp. 29–30 (3 pages), May 1992.*

(List continued on next page.)

Primary Examiner—Matthew Smith
Assistant Examiner—Phallaka Kik
(74) Attorney, Agent, or Firm—Jonathan T. Kaplan, Esq.; Howrey, Simon, Arnold & White, LLP

(57) ABSTRACT

In the design of digital integrated circuits, it is often desirable to formally verify whether an implementation design is equivalent to a reference design. The present invention facilitates such formal verification by determining "necessary correspondences" between inputs or outputs of the two circuits to be compared for equivalency. Necessary correspondences are so called because while they establish necessary conditions for equivalency to occur, they are not sufficient to determine that equivalency actually exists. Once such necessary correspondences have been determined, algorithms to determine actual equivalency can be more strategically applied. It is often cost-effective (i.e. more efficient), as part of an equivalency-determining circuit design tool, to first apply the teachings of the present invention in order to lessen subsequent application of an equivalency determining method. The present invention finds necessary correspondences between the combinational portions of two circuits by utilizing a graph-coloring algorithmic approach applied to a simplified bipartite representation. The bipartite representation is determined for each circuit to be compared. Each bipartite representation is comprised of a left set of nodes (representing inputs), a right set of nodes (representing outputs) and a set of edges which connect the nodes of the left and right sets. The bipartite representation is "primed" by coloring the nodes of each circuits' left and right sets on the basis of information known about the circuits. The basic cycle by which the invention operates comprises the performance of a recoloring procedure followed by the performance of consistency and progress checks. The consistency and progress checks analyze the results of the recolorings to identify necessary correspondences and to determine whether further searching for additional necessary correspondences should be performed.

24 Claims, 15 Drawing Sheets

OTHER PUBLICATIONS

Geurts et al., "Quadratic zero–one programming–based synthesis of application–specific data paths", IEEE Transactions on Computer–Aided Design of Integrated Circuits and Systems, vol. 14, No. 1, pp. 1–11, Jan. 1995.*

Ranganathan et al., "A linear systolic algorithm and architecture for convex bipartite matching", Proceedings of 3rd International Conference on High Performance Computing, Dec. 19, 1996, pp. 379–384.*

Ghosh et al., "Synthesis of wiring signature–invariant equivalence class circuit mutants and applications to benchmarking", Proceedings of design, Automation, and Test in Europe, Feb. 23, 1998, pp. 656–663.*

Jerry R. Burch and Vigyan Singhal, "Robust Latch Mapping for Combinational Equivalence Checking", International Conference on Computer Aided Design, Nov. 1998.

Miles Ohlrich, Carl Ebeling, Eka Ginting and Lisa Sather, "SubGemini: Identifying SubCircuits using a Fast Subgraph Isomorphism Algorithm", Design Automation Conference 1993.

Carl Ebeling, "Geminill: A Second Generation Layout Validation Program", International Conference on Computer Aided Design 1988.

Carl Ebeling and Ofer Zajicek, "Validating VLSI Circuit Layout By Wirelist Comparison", International Conference on Computer Aided Design 1983.

* cited by examiner

Step 101: Produce bipartite representation of circuit1 and circuit2 called, respectively, circuit1_simp and circuit2_simp Step 102: Prime circuit1_simp and circuit2_simp by assigning colors to the nodes of each circuit based upon information about that circuit Step 103: Perform bin sort of nodes Step 104: Perform consistency and progress checks Step 105: Have all nodes been matched?
    Yes, end necessary correspondences determination.
    No, go to Step 106.

Step 106: Perform recoloring of sides of circuit1_simp and circuit2_simp opposite to the last side recolored. If this is first execution of recoloring step, then choose, arbitrarily, to recolor the same side of circuit1_simp and circuit2_simp.

Step 107: Perform insertion sort of nodes on side just recolored.

Step 108: Perform consistency and progress checks

Step 109: Have all nodes been matched?
    Yes, end necessary correspondences determination.
    No, go to Step 110.

FIG. 1A

Step 110: Has progress been made of recolored side relative to last time this same side was recolored?

Yes, go to Step 106.

No, go to Step 111.

Step 111: Was progress made of opposite side last time it was recolored?

Yes, go to Step 106.

No, end necessary correspondences determination.

FIG. 1B

| circuit1_simp.left | circuit2_simp.left |
|---|---|
| 1 | 1 |
| 5 | 3 |
| 5 | 5 |
| 5 | 5 |
| 6 | 5 |
| 6 | 6 |

FIG. 2 circuit1 circuit2 circuit1_simp.left                                circuit1_simp.right circuit2_simp.left                                circuit2_simp.right circuit1_simp.left        circuit1_simp.right

[0000 0001] < I1 >

< R1$_D$ > [0000 0101]

[0000 0001] < I2 >

< R2$_D$ > [0000 0101]

[0000 0001] < I3 >

< O1 > [0000 0111]

[0000 0010] < R1$_Q$ >

< O2 > [0000 1000]

[0000 0010] < R2$_Q$ > circuit2_simp.left        circuit2_simp.right

METHOD AND APPARATUS FOR STRUCTURAL INPUT/OUTPUT MATCHING FOR DESIGN VERIFICATION

FIELD OF THE INVENTION

The present invention relates generally to circuit design verification, and more particularly to structural circuit design verification.

BACKGROUND OF THE INVENTION

In the design of digital integrated circuits, it is often desirable to be able to ascertain whether two circuits are equivalent. In particular, the determination of circuit equivalency has become increasingly important with the emergence of large scale digital integrated circuits that incorporate an entire system on a chip. Such chips have reached a size and complexity level where it is difficult to verify them, in a timely manner, using traditional gate-level simulation. As a result, static verification tools are being more widely utilized by chip designers. Examples of such static-verification tools are PrimeTime, a static-timing analyzer, and Formality, a formal verification tool. Both PrimeTime and Formality are products of Synopsys, Inc., 700 East Middlefield Road, Mountain View, Calif. Static-timing analysis is used to analyze and verify the timing of the design and formal verification is used to verify a design's functionality by proving functional equivalence.

A design methodology that utilizes formal verification can reduce the number of time-consuming gate-level simulation runs. In a typical design process, utilizing logic synthesis and formal verification tools, the designer specifies his or her initial design at the register-transfer level (RTL). This RTL source specification is translated into a gate-level netlist by a logic synthesis tool, such as Design Compiler, produced by Synopsys, Inc., 700 East Middlefield Road, Mountain View, Calif. Formal verification is then used to compare the functional equivalency of the RTL source specification to the post-synthesis gate-level netlist. This gate-level netlist may then undergo several succeeding transformations that are intended to produce equivalent gate-level netlists. Such succeeding transformations can include: scan chain insertion, clock-tree synthesis, in-place optimization and manual editing. After each of these succeeding transformations, formal verification can be used to verify that the result of the latest transformation is functionally equivalent to the resulting gate-level netlist of the preceding transformation. For each of these comparisons a known-to-be-correct design (reference design) is compared against a design of unknown correctness (implementation design).

Formality operates by identifying "compare points" which are points in the reference and implementation designs that are examined for equivalency. If all compare points in the implementation design are found equivalent to a corresponding compare point in the reference design, then the two designs are, in total, equivalent to each other.

Three major components comprise the Formality architecture: a verification manager, a suite of verification solvers and a debug analyzer. The verification manager is responsible for determining the corresponding compare point of the reference design that should be compared for functional equivalency against each compare point of the implementation design. The verification manager also determines the logic cone for each compare point. The logic cone for each compare point is found by following each compare point's transitive fanin until a primary input, or another compare point, is reached. These primary inputs or compare points, which define the transitive fanin boundary of a compare point, shall be referred to as the compare point's logic cone inputs. In addition to determining the corresponding compare point of the reference design, for each compare point of the implementation design, the verification manager also "aligns" the logic cone inputs for such paired compare points. The verification manager accomplishes this by determining the logic cone input of the reference design's compare point, that should be correspond to each logic cone input of the implementation design's compare point, when functional equivalency of the compare points for the two logic cones is being determined.

Once such compare point matching and logic cone input alignment has been determined, algorithms to determine equivalency can be applied. Formality chooses the most appropriate equivalency-determining algorithm (referred to as a "solver") from its suite of verification solvers. For example, a binary decision diagram (BDD) based solver may be used for compare points driven by complex control logic, but other algorithms may be more efficient for data path circuits.

Equivalency of two combinational circuits can be defined, in a functional sense, as follows. The reference and implementation designs are equivalent if both accept the same set of input combinations, and if both produce the same output combination for each input combination. Equivalency can also be defined, in a less strict sense, if don't cares are allowed in the reference design's input combinations. In that case, the implementation design only needs to define the same function over those input patterns for which the reference design is defined.

If Formality discovers errors during the verification process, the designer can identify nets or instances of the implementation design that may be responsible for the errors with the Formality debug analyzer.

Determining the corresponding compare points between the reference and implementation designs, and aligning the logic cone inputs of the compare points, is important for formal verification systems, such as Formality, since it permits the relatively computationally expensive equivalency-determining algorithms to be strategically applied. It would therefore be desirable to improve the speed and specificity with which such compare point correspondences, and logic cone alignments, can be found.

SUMMARY OF THE INVENTION

For purposes of describing the present invention, the determination of compare point correspondences, and logic cone input alignments, shall be referred to as the determination of "necessary correspondences" between inputs or outputs of the two circuits to be compared. A necessary correspondence between a first output of a first circuit and a first output of a second circuit indicates that both the following statements are true: i) if the first output of the first circuit is equivalent to an output of the second circuit, then that equivalent output must be the first output of the second circuit; and ii) if the first output of the second circuit is equivalent to an output of the first circuit, then that equivalent output must be the first output of the first circuit. A necessary correspondence between a first input of a first circuit and a first input of a second circuit indicates that both the following statements are true: i) if the first input of the first circuit is equivalent to an input of the second circuit, then that equivalent input must be the first input of the second circuit; and ii) if the first input of the second circuit is equivalent to an input of the first circuit, then that equivalent input must be the first input of the first circuit. These necessary correspondences are so called because while they establish necessary conditions for equivalency to occur, they are not sufficient to determine that equivalency actually exists.

Once such necessary correspondences have been determined, algorithms to determine actual equivalency can be more strategically applied. The present invention comprises a method for determining such necessary correspondences in an efficient way such that the cost of utilizing it is often much smaller than the cost of utilizing equivalency-determining methods. Therefore, it is often cost-effective (i.e. more efficient), as part of an equivalency-determining circuit design tool, to first apply the teachings of the present invention in order to lessen subsequent application of an equivalency determining method.

The present invention presents an efficient method for finding necessary correspondences between the combinational portions of two circuit designs utilizing a graph-coloring algorithmic approach applied to a simplified bipartite representation of the two circuits to be matched.

The major steps of the necessary correspondences procedure of the present invention are as follows.

The bipartite representation is determined for each circuit to be compared. Each bipartite representation is comprised of a left set of nodes, a right set of nodes and a set of edges which connect the nodes of the left and right sets. Primary inputs and primary outputs of a circuit are represented, respectively, by nodes in the left set and nodes in the right set of the simplified representation. Other "input" and "output" nodes also need to be represented in the left and right sets in order that a matching of the combinational circuitry be performed by the invention. In particular, registers internal to the circuits to be matched result in left and right nodes of their simplified representations. Inputs to a register become outputs in the bipartite representation, since they are connected to outputs of combinational circuitry, and are put in the right set of the circuit's bipartite representation. Outputs from a register become inputs in the bipartite representation, since they are connected to inputs of combinational circuitry, and are put in the left set of the circuit's bipartite representation.

The approach to matching of the present invention is "structural" matching in the sense that it is these bipartite graph structures which are being matched with each other. Any input circuit design representation, from which such a bipartite graph representation can be determined, can be matched for necessary correspondences with the present invention.

The bipartite representation is "primed" by coloring the nodes of each circuits' left and right sets on the basis of information known about the circuits. Three main strategies for priming are utilized, with the unifying principle, of all three strategies, that any two nodes which could potentially be identified as having a necessary correspondence with each other cannot be primed with different colors.

Consistency and progress checks of the primed bipartite representation are made as follows.

In general, consistency checks determine whether the coloring that has just been accomplished has resulted in matching nodes (i.e. nodes which in fact share a necessary correspondence) or in invalid nodes (i.e. nodes which are treated as not having a necessary correspondence). A "match" is defined to have occurred if two nodes, one from each circuit, are: i) both in the same left or right side of their respective circuit, and ii) both possess the same unique color with respect to all other nodes on their side of the circuits.

The following first application of the consistency checking procedure, following the initial priming of the nodes, is first applied with respect to one side of both circuits and is then applied to the other side of both circuits. As will be discussed below, all further applications of the consistency checking procedure, having occurred after at least one application of the recoloring procedure, are applied only to the side of both circuits which has just been recolored.

All "maximal uniform groups" of one or more nodes are identified on the same side of each circuit. A maximal uniform group is one in which all of its nodes share the same color, and no other nodes, of that side of that circuit, have the same color. For all maximal uniform groups containing only one node, if there is a maximal uniform group for the same side of the other circuit having the same color and same number of nodes (one node), then both groups are indicated as having matched nodes. For each maximal uniform group of one or more nodes, if there exists no maximal uniform group for the same side of the other circuit having the same color, then all nodes of the maximal uniform group are colored invalid. For each maximal uniform groups of two or more nodes, if there exists a maximal uniform group for the same side of the other circuit having the same color, but having a different number of nodes, then all nodes in both maximal uniform groups are colored invalid.

Progress checks determine whether the procedure for identifying necessary correspondences should continue. While more complex progress checks are performed later in this process, at this point in the procedure the progress check merely determines whether all nodes have already been matched. If they have been (an unlikely event), then no further identification of necessary correspondences is performed. If all nodes have not already been matched, then the recoloring procedure is executed.

The recoloring procedure operates as follows. Each time the recoloring procedure is executed, it alternates between the side of each circuit which is recolored. When called initially, the side to be recolored is arbitrarily chosen. The side to be recolored shall be referred to as the "target" side, and the side serving purely as data for recoloring the target shall be referred to as the "source" side. Recoloring is performed on a node-by-node basis for each node of the target side. The current node of the target side to be recolored shall be referred to as the "target node." The nodes on the source side, which are connected by an edge to the target node, shall be referred to as "source nodes." The general default rule for recoloring each target node is that it gets its own previous color value, plus the sum of the values of each of its source nodes.

Consistency and progress checks are then performed of the just recolored sides. As discussed above, the consistency checking procedure looks for nodes which should be marked as matched or nodes which should be marked invalid. It should be noted, however, that the consistency checking procedure described above is applied, at this point in the overall necessary correspondences procedure, only to the side of both circuits which has just been recolored. The progress check then performs tests to determine whether the necessary correspondences procedure should be terminated, or whether it should continue for at least another iteration by looping back to perform another recoloring step.

Progress checks are then performed as follows. The results of the progress checks are to set certain progress indicators. If all nodes on both sides of both circuits are marked as having been matched, following the just-previous consistency check, then an "all-matched" progress indicator is set. In addition to this "all-matched" progress indicator, the following progress checks also determine whether a "side-progress" progress indicator should be set. If at least one new match has been identified, by the just-previous consistency check, then the "side-progress" progress indicator, for the side of the circuits just recolored, is set. If at least one new invalid node has been identified, by the just-previous consistency check, then the "side-progress" progress indicator, for the side of the circuits just recolored, is set. A count is also performed of the number of maximal uniform groups, for the circuit sides that have just been recolored and consistency checked. If this count is greater than the last time this count was taken, after the same side of the same circuit was last recolored and consistency checked, then the "side-progress" progress indicator, for the side of the circuits just recolored, is set.

A check is then made to determine whether the "all-matched" progress indicator has been set. If the result of this query is positive, then the procedure for necessary correspondences determination is terminated. If the result of this query is negative, then a check is made to determine whether the "side-progress" progress indicator, for the just-recolored circuit side, has been set. If the result of this query is positive, then the necessary correspondences procedure continues by looping back for another execution of the recoloring procedure. If the result of this query is negative, then a check is made to determine whether the "side-progress" progress indicator, for the side opposite to the side just-recolored, has been set. If the result of this query is positive, then the necessary correspondences procedure continues by looping back for another execution of the recoloring procedure. If the result of this query is negative, then the determination of necessary correspondences is halted due to the lack of progress.

Advantages of the invention will be set forth, in part, in the description that follows and, in part, will be understood by those skilled in the art from the description or may be learned by practice of the invention. The advantages of the invention will be realized and attained by means of the elements and combinations particularly pointed out in the appended claims and equivalents.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIGS. 1A and 1B show a procedure for determining necessary correspondences in accordance with the present invention;

FIG. 2 depicts an example intermediate stage of necessary correspondence determination during which invalid or matching nodes, between the two circuits, are to be found;

FIGS. 4A through 4J show the stages in which the exemplary circuits of FIG. 3 are processed in accordance with the procedure of FIG. 1.

DETAILED DESCRIPTION OF PREFERRED EMBODIMENTS

Figure 3:
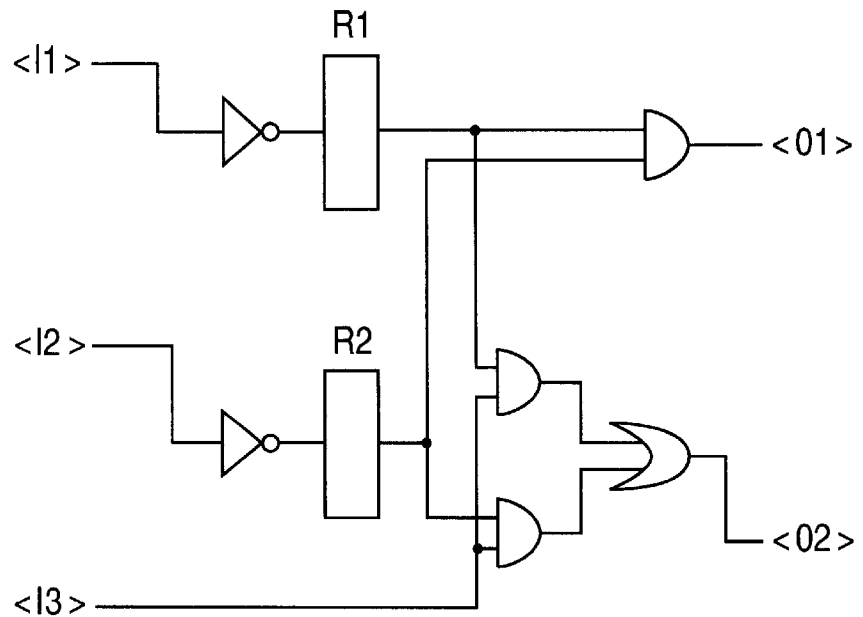
FIG. 3 illustrates an exemplary pair of circuits for input to the necessary correspondences procedure of the present invention.
Figure 3:
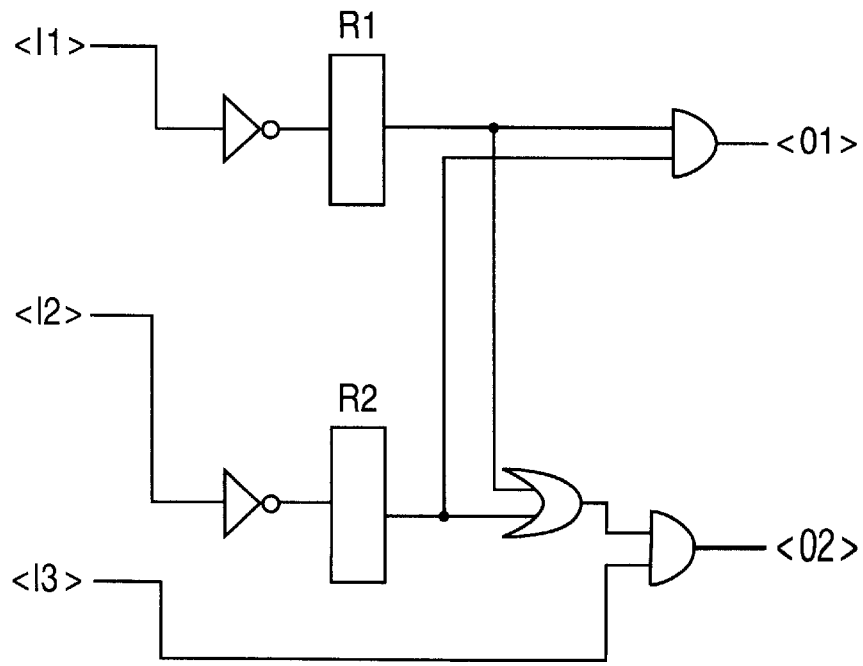

Reference will now be made in detail to preferred embodiments of the invention, examples of which are illustrated in the accompanying drawings. Wherever possible, the same reference numbers will be used throughout the drawings to refer to the same or like parts.

For purposes of describing the present invention, the determination of compare point correspondences, and logic cone input alignments, shall be referred to as the determination of "necessary correspondences" between inputs or outputs of the two circuits to be compared. A necessary correspondence between a first output of a first circuit and a first output of a second circuit indicates that both the following statements are true: i) if the first output of the first circuit is equivalent to an output of the second circuit, then that equivalent output must be the first output of the second circuit; and ii) if the first output of the second circuit is equivalent to an output of the first circuit, then that equivalent output must be the first output of the first circuit. A necessary correspondence between a first input of a first circuit and a first input of a second circuit indicates that both the following statements are true: i) if the first input of the first circuit is equivalent to an input of the second circuit, then that equivalent input must be the first input of the second circuit; and ii) if the first input of the second circuit is equivalent to an input of the first circuit, then that equivalent input must be the first input of the first circuit. These necessary correspondences are so called because while they establish necessary conditions for equivalency to occur, they are not sufficient to determine that equivalency actually exists.

Once such necessary correspondences have been determined, algorithms to determine actual equivalency can be more strategically applied. The present invention comprises a method for determining such necessary correspondences in an efficient way such that the cost of utilizing it is often much smaller than the cost of utilizing equivalency-determining methods. Therefore, it is often cost-effective, as part of an equivalency-determining circuit design tool, to first apply the teachings of the present invention in order to lessen subsequent application of an equivalency determining method.

The present invention presents an efficient method for finding necessary correspondences between the combinational portions of two circuit designs utilizing a graph-coloring algorithmic approach applied to a simplified bipartite representation of the two circuits to be matched. Due to the structure of the simplified bipartite representation utilized, the present invention has certain limitations as applied to the problem of digital integrated circuit design. Specifically, if there are redundant inputs or outputs of a circuit, it is possible for a circuit optimizer to structurally change the optimized circuit such that at least some of the inputs or outputs of the optimized circuit can no longer be matched with the original circuit by utilizing the present invention.

The major steps of the necessary correspondences procedure of the present invention are depicted in FIG. 1. Step 101 produces the simplified bipartite representation of the two circuits, circuit1 and circuit2, to be matched for necessary correspondences. Note that identification of which of circuit1 and circuit2 is the reference design, and which of circuit1 and circuit2 is the implementation design, is not necessary for the following discussion. The bipartite representations of circuit1 and circuit2 are referred to, respectively, as circuit1_simp and circuit2_simp. Each such simplified circuit representation is comprised of three main components: i) a representation of the circuit's input nodes, which we shall refer to as the "left" set of circuit nodes, ii) a representation of the circuit's output nodes, which we shall refer to as the "right" set of circuit nodes and iii) the representation of edges connecting input nodes of a circuit to its output nodes. With regard to circuit1_simp and circuit2_simp, we shall refer, respectively, to the left sets of circuit nodes as circuit1_simp.left and circuit2_simp.left; and we shall refer, respectively, to the right sets of circuit nodes as circuit1_simp.right and circuit2_simp.right. An edge is created, connecting a left node of a circuit to a right node of the same circuit if, and only if, at least one path exists in the actual circuit between these two nodes.

Primary inputs and primary outputs of a circuit are represented, respectively, by nodes in the left set and nodes in the right set of the simplified representation. Other "input" and "output" nodes also need to be represented in the left and right sets in order that a matching of the combinational circuitry be performed by the invention. In particular, registers internal to the circuits to be matched result in left and right nodes of their simplified representations. Inputs to a register become outputs in the bipartite representation, since they are connected to outputs of combinational circuitry, and are put in the right set of the circuit's bipartite representation. Outputs from a register become inputs in the bipartite representation, since they are connected to inputs of combinational circuitry, and are put in the left set of the circuit's bipartite representation.

The approach to matching of the present invention is "structural" matching in the sense that it is these bipartite graph structures which are being matched with each other. Any input circuit design representation, from which such a bipartite graph representation can be determined, can be matched for necessary correspondences with the present invention.

Step 102 comprises the "priming" the bipartite representation by coloring the nodes of each circuits' left and right sets on the basis of information known about the circuits. There are two main strategies for priming. A unifying principle of both strategies is that any two nodes which could potentially be identified as having a necessary correspondence with each other cannot be primed with different colors.

The first priming strategy has two main stages. The first stage colors the nodes of each circuit into a maximum of the same four groups. This is accomplished by assigning a unique color to each of the four following types of nodes: nodes of the left set representing primary inputs, nodes of the left set representing register outputs, nodes of the right set representing primary outputs and nodes of the right set representing register inputs. The same four colors are utilized, in the same way, to color nodes of both circuits to be compared. The second stage, of the first priming strategy, overrides coloring accomplished by the first stage. The second stage: i) uniquely colors each pair of nodes between the two circuits which the circuit designer has indicated as sharing a necessary correspondence, and ii) also indicates the nodes of each such pair as being matched nodes. Further discussion of the matched indication is presented below.

The second main strategy for priming is to assign all nodes in both circuits the color "clear," except for those pairs of nodes which the circuit designer has indicated as having a necessary correspondence. Each such pair of nodes is given a unique color and are indicated as being "matched" nodes.

In Step 103, the primed nodes of each side of each circuit are sorted, according to color, in numerically increasing order. The preferable sort to use in this circumstance is the bin sort since the bin sort is highly efficient in situations where the initial list to be sorted is highly un-sorted, and where there are relatively few different values among the items to be sorted. Having at most four colors to sort, for example, if the first priming strategy is used, is a relatively small number of values that is well-suited to bin sort.

In Step 104, consistency and progress checks are made as follows.

In general, consistency checks determine whether the coloring that has just been accomplished has resulted in matching nodes (i.e. nodes which in fact share a necessary correspondence) or in invalid nodes (i.e. nodes which are treated as not having a necessary correspondence).

A "match" is defined to have occurred if two nodes, one from each circuit, are: i) both in the same left or right side of their respective circuit, and ii) both possess the same unique color with respect to all other nodes on their side of the circuits. If the consistency check finds a match, then both nodes are so is indicated by having the highest bit of their color-holding word set to high.

The following first application of the consistency checking procedure, following the initial priming of the nodes, is first applied with respect to one side of both circuits and is then applied to the other side of both circuits. As will be discussed below, all further applications of the consistency checking procedure, having occurred after at least one application of the recoloring procedure, are applied only to the side of both circuits which has just been recolored.

All "maximal uniform groups" of one or more nodes are identified on the same side of each circuit. A maximal uniform group is one in which all of its nodes share the same color, and no other nodes, of that side of that circuit, have the same color. Nodes colored as "clear," "invalid" or "matched" are not counted for purposes of identifying maximal uniform groups. For all maximal uniform groups containing only one node, if there is a maximal uniform group for the same side of the other circuit having the same color and same number of nodes (one node), then both groups are indicated as having matched nodes by having the high-order bit of their color words set to one. While the lower-order color-indicating bits of the matched nodes may be left with the same color, it may be preferable to change the color to another color that is a prime number, or some other number which enhances further matching, in accordance with wellknown principles of graph-coloring algorithms. For each maximal uniform group of one or more nodes, if there exists no maximal uniform group for the same side of the other circuit having the same color, then all nodes of the maximal uniform group are colored invalid. For each maximal uniform groups of two or more nodes, if there exists a maximal uniform group for the same side of the other circuit having the same color, but having a different number of nodes, then all nodes in both maximal uniform groups are colored invalid.

Progress checks determine whether the procedure for identifying necessary correspondences should continue. While more complex progress checks are performed in Step 108 (discussed below), at this point in the procedure the progress check merely determines whether all nodes have already been matched. If they have been (an unlikely event, except for very trivial circuits or circuits where the circuit designer has already supplied a large amount of matching information), then no further identification of necessary correspondences is performed and a circuit design tool, incorporating the principles of the present invention could, for example, then proceed to an identification of whether the necessary corresponding nodes are equivalent. If all nodes have not already been matched, then the recoloring procedure of Step 106 is executed next.

The recoloring procedure of Step 106 operates as follows. Each time Step 106 is executed, it alternates between the side of each circuit which is recolored. When called initially, the side to be recolored is arbitrarily chosen. The side to be recolored shall be referred to as the "target" side, and the side serving purely as data for recoloring the target shall be referred to as the "source" side. Recoloring is performed on a node-by-node basis for each node of the target side. The current node of the target side to be recolored shall be referred to as the "target node." The nodes on the source side, which are connected by an edge to the target node, shall be referred to as "source nodes." The rules for performing recoloring, in terms of the target node and its source nodes, are as follows.

The general default rule for recoloring each target node is that it gets its own previous color value, plus the sum of the values of each of its source nodes. The edges connecting the source nodes to the target node may introduce coefficients into this default equation. Specifically, a source node's color value may be first multiplied by the coefficient associated with the edge connecting it to the target node, and the resulting product is then included in the sum with which the target node is updated. By default, the coefficients associated with edges are of value one and may therefore be ignored. The exceptions to this default recoloring rule are as follows.

If the target node is a matched node, then its value is unchanged. In effect, the target node is updated with a sum which just includes its own previous value.

For each source node that is a matched node, the color value of its lower-order bits only, ignoring the highest level bit which has been set to indicate its matched status, is included in the sum for updating the target node.

If the target node is invalid, or if at least one of the source nodes is invalid, then the recolored value of the target node is invalid. The "invalid" color can be indicated by a special value assigned to a node, such as the maximum integer value.

Any node which is colored "clear," regardless of whether it is the target node or a source node, acts as having the value of zero for purposes of computing the sum by which the target node is recolored. The "clear" color can be indicated by the value zero or by a special predetermined value, such as the maximum integer value minus one.

Once the recoloring has been performed on the selected side of both circuits, a re-sorting of the recolored nodes is preferably performed as depicted by Step 107. This sort is preferably accomplished by an insertion sort since the nodes of the recolored sides are already largely sorted. Insertion sort operates by performing a copy operation, node by node, of each node of a current list to the end of a copy list. If, however, the node to be copied to the copy list would not be in order if placed on the end of the copy list, then a search is performed of the copy list until a suitable insertion point is found.

Step 108 then performs consistency and progress checks of the just recolored sides. As discussed above with respect to Step 104, the consistency checking procedure looks for nodes which should be marked as matched or nodes which should be marked invalid. The progress check then performs tests to determine whether the necessary correspondences procedure should be terminated, or whether it should continue for at least another iteration by looping back to Step 106. Since the operation of the consistency checking procedure is the same as described above, a discussion of its operation will not be repeated here. It should be noted, however, that the consistency checking procedure is described above is applied, in Step 108, only to the side of both circuits which has just been recolored.

Progress checks are then performed as follows. The results of the progress checks are to set certain progress indicators. If all nodes on both sides of both circuits are marked as having been matched, following the just-previous consistency check, then an "all-matched" progress indicator is set. This "all-matched" indicator is the only progress indicator that is set in the above discussion of the progress check of Step 104. In addition to this "all-matched" progress indicator, the following progress checks of Step 108 determine whether the "side-progress" progress indicator should be set. If at least one new match has been identified, by the just-previous consistency check, then the "side-progress" progress indicator, for the side of the circuits just recolored, is set. If at least one new invalid node has been identified, by the just-previous consistency check, then the "side-progress" progress indicator, for the side of the circuits just recolored, is set. A count is also performed of the number of maximal uniform groups, for the circuit sides that have just been recolored and consistency checked. Rather than counting the number of maximal uniform groups on the same side of both circuits, a count of one side of one circuit is sufficient (since this must be equal to the count of the same side of the other circuit as a result of the just-performed consistency check). If this count is greater than the last time this count was taken, after the same side of the same circuit was last recolored and consistency checked, then the "side-progress" progress indicator, for the side of the circuits just recolored, is set.

In Step 109 a check is made to determine whether the "all-matched" progress indicator has been set. If the result of this query is positive, then the procedure for necessary correspondences determination is terminated. If the result of this query is negative, then Step 110 is executed.

Step 110 checks whether the "side-progress" progress indicator, for the just-recolored circuit side, has been set. If the result of this query is positive, then the necessary correspondences procedure continues by looping back to is Step 106. If the result of this query is negative, then Step 111 is executed.

Step 111 checks whether the "side-progress" progress indicator, for the side opposite to the side just-recolored, has been set. If the result of this query is positive, then the necessary correspondences procedure continues by looping back to Step 106. If the result of this query is negative, then the determination of necessary correspondences is halted since the lack of progress on both sides of the circuits is a strong indicator that no further matching can be accomplished. If desired, however, the necessary correspondences procedure could be modified such that additional iterations are attempted before a conclusion, that no further progress is possible, is made.

The consistency checking procedure, in its identification of maximal uniform groups, is aided by examining nodes which have been sorted according to their color value. This sorting is accomplished by Steps 103 and 107 as discussed above.

The following discussion, of how the consistency checking procedure is aided by sorting, will assume an ascending color-order sort, although a descending sort could alternatively be used, to equally great advantage, with the necessary changes made to the following discussion. The following discussion also assumes that invalid is the maximum integer value and that clear is the maximum integer value minus one.

There is a pointer, circuit1_simp.left_ptr, which points to the current node of circuit1_simp.left; a pointer, circuit1_simp.right_ptr, which points to the current node of circuit1_simp.right; a pointer, circuit2_simp.left_ptr, which points to the current node of circuit2_simp.left; and a pointer, circuit2_simp.right_ptr, which points to the current node of circuit2_simp.right. The following discussion covers the operation of a consistency check for the right sides of the circuits, but would also apply with the necessary changes to the left sides of the circuits.

circuit1_simp.right_ptr begins by pointing to the node on the right side of circuit1_simp with the smallest color value, while circuit2_simp.right_ptr begins by pointing to the node on the right side of circuit2_simp with the smallest color value. For each of these two pointers that is pointing to a node that is not colored invalid, clear or matched, the beginning of a maximal uniform group is indicated. Each pointer proceeds until the beginning of another maximal uniform group is detected, or until a node colored invalid, clear or matched is detected. If each pointer has detected a maximal uniform group of one node and the nodes are of the same color, then both nodes are indicated as matched. If one pointer has detected a maximal uniform group of one or more nodes and the other pointer has detected no nodes that are not invalid, clear or matched, then all nodes of the maximal uniform group are indicated invalid. If each pointer has detected a maximal uniform group of the same color, but with different numbers of nodes, then all nodes of both maximal uniform groups are marked invalid. If each pointer has detected a maximal uniform group of the same color, and with the same number of nodes, then no recoloring is performed on any of the nodes in both groups. Each of the above cases addresses a situation where either both pointers have found maximal uniform groups of the same color, or where a maximal uniform group is found by only one pointer. For those cases above where both pointers have found a maximal uniform group of the same color, both pointers will simply continue to identify the next maximal uniform group within their respective sorted sets of nodes. For those cases where only one pointer has found a maximal uniform group, then only that pointer will advance in order to identify additional maximal uniform groups.

For the case, not dealt with above, where each pointer has located a maximal uniform group of a different color, the following actions are taken. All nodes of the maximal uniform group with the numerically smaller color are marked invalid. Then only the pointer which located this numerically smaller colored group is advanced such that the next maximal uniform group is located.

Example Consistency and Progress Check

An example of how sorting assists the consistency checking procedure, of a consistency and progress check, is depicted in FIG. 2.

Both circuit1_simp.left_ptr and circuit2_simp.left_ptr begin by pointing to a node colored with the value one. Both these pointers then advance one node such that circuit1_simp.left_ptr is pointing to a node colored 5 and circuit2_simp.left_ptr is pointing to a node colored 3. Since both pointers have advanced past the color one, we know that the maximal uniform group for color one has been identified for the left side of both circuits. Since these maximal uniform groups each contain only one node, and the nodes are colored the same, both nodes are indicated as being matched.

circuit1_simp.left_ptr is then advanced until it reaches a node colored 6, while circuit2_simp.left_ptr is advanced until it reaches a node colored 5. At this point it is known that the maximal uniform group of circuit1_simp.left for the color 5 has been identified, and the maximal uniform group of circuit2_simp.left for color 3 has been found. The node of circuit2_simp.left colored 3 is marked invalid (since a match in circuit1_simp.left cannot be found further down the list). Then only circuit2_simp.left_ptr is advanced until it reaches the color 6, at which point the maximal uniform group of circuit2_simp.left for the color 5 has been found.

Since the maximal uniform group of color 5 for circuit1_simp.left is the same size as the maximal uniform group of color 5 for circuit2_simp.left, both circuit1_simp.left_ptr and circuit2_simp.left_ptr simply advance in order to identify the next maximal uniform group in each. The next maximal uniform group identified in both circuit1_simp and in circuit2_simp are of color 6. Since the group of color 6 identified in circuit1_simp has two nodes, and the group of color 6 identified in circuit2_simp has only one node, all nodes of both these groups are marked invalid.

Exemplary Pair of Circuit Designs

FIGS. 3 and 4 depict a more complete example of the operation of the present invention, beginning with the input of two exemplary circuits for necessary correspondences matching.

FIG. 3 depicts a circuit1 and a circuit2, with circuit2 being an optimized version of circuit1. The question is whether the optimizations, performed on circuit1 to arrive at circuit2, have changed its functionality. In terms of a formal verification tool, circuit1 is typically the reference design while circuit2 is typically the implementation design. As part of the formal verification process, it is desirable to identify, with the teachings of the present invention, the necessary correspondence points.

Figure 4A:
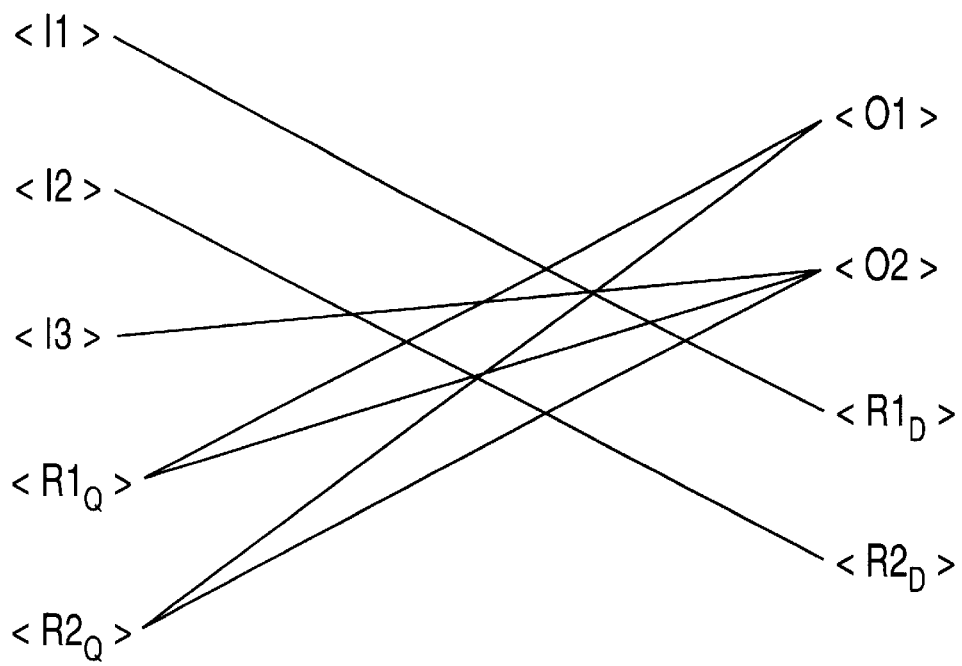
Figure 4A:
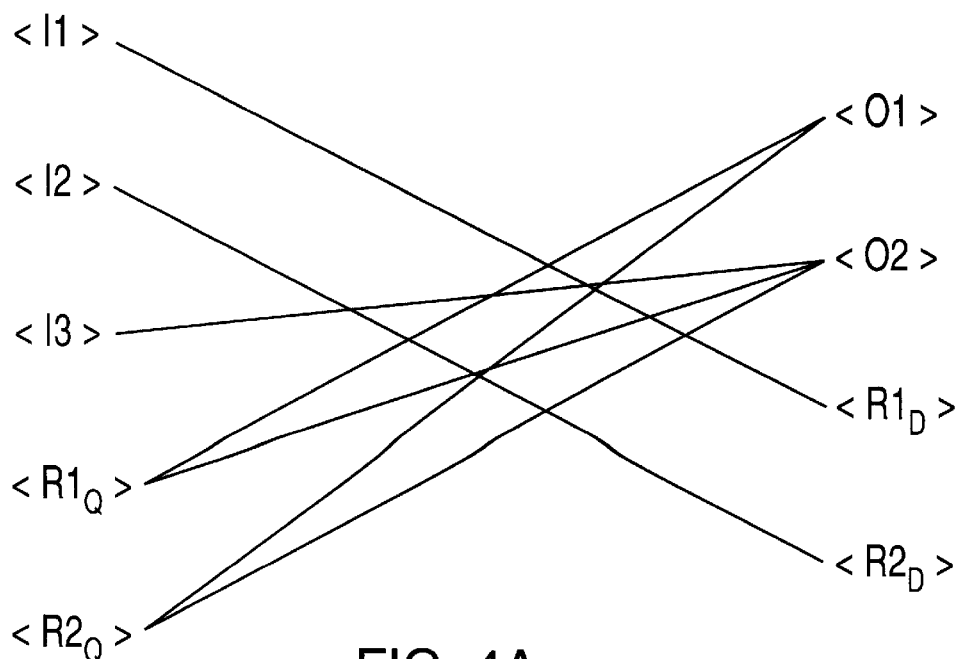

FIG. 4A shows the results of applying Step 101 to circuit1 and circuit2 in order to produce, respectively, simplified bipartite representations circuit1_simp and circuit2_simp. As can be seen, the inputs and outputs of each register have become, respectively, outputs and inputs in the bipartite representation.

Figure 4B:
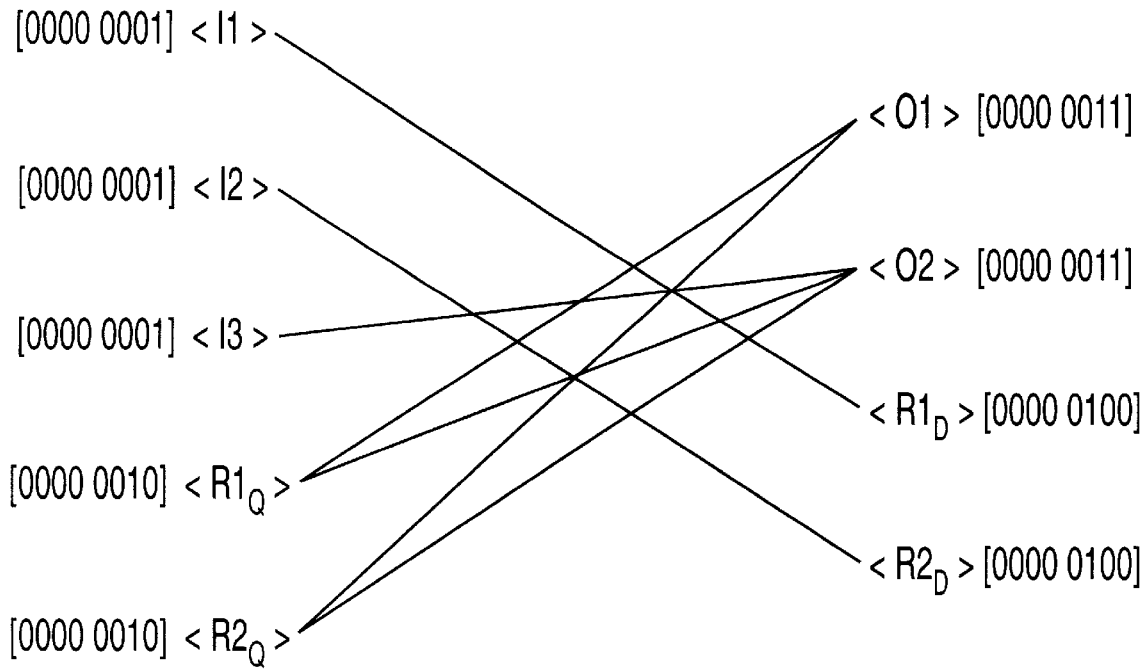
Figure 4B:
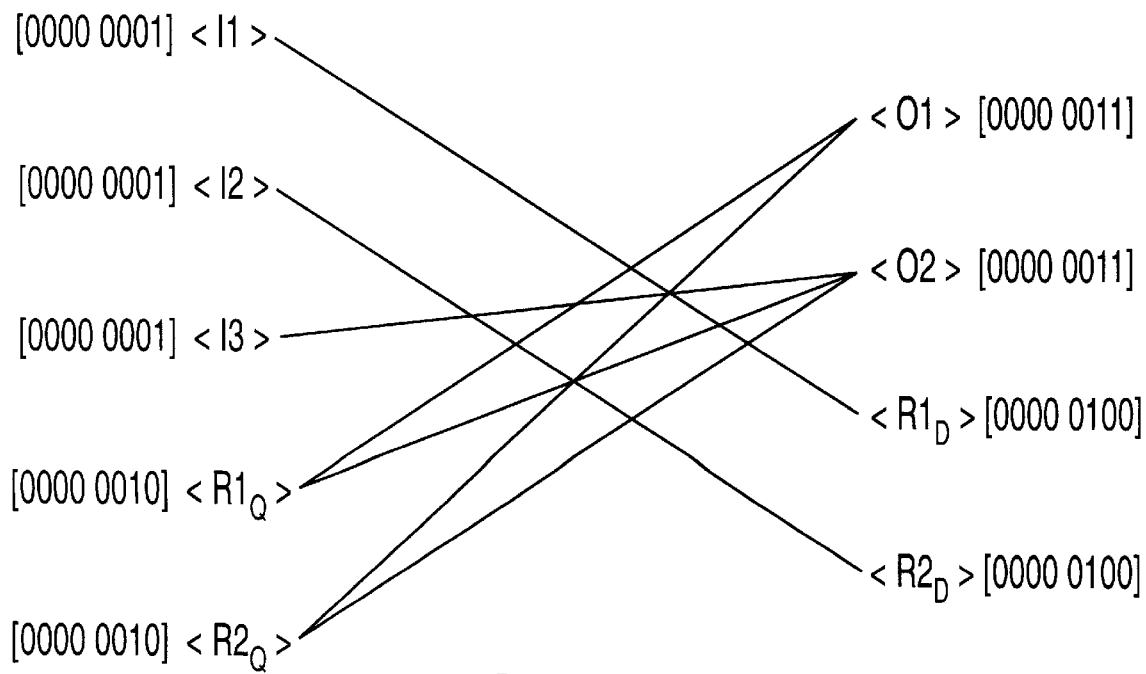

FIG. 4B illustrates the results of applying Step 102 to circuit1_simp and circuit2_simp. As can be seen, the first priming strategy has been followed in which the color 1 has been assigned to primary inputs, the color 2 to register outputs, the color 3 to primary outputs and the color 4 to register inputs. These colors are shown in binary, assuming, for simplicity of exposition, that the node field for holding color values is only 8 bits.

FIG. 4B also shows the results of applying the bin sort of Step 103, since each set of nodes is already in ascending order.

FIG. 4B also shows the results of applying the consistency and progress checks of Step 104, since no invalid or matched nodes are identified. Since no nodes are matched, the query of Step 105 is answered negative and processing continues with Step 106.

Figure 4C:
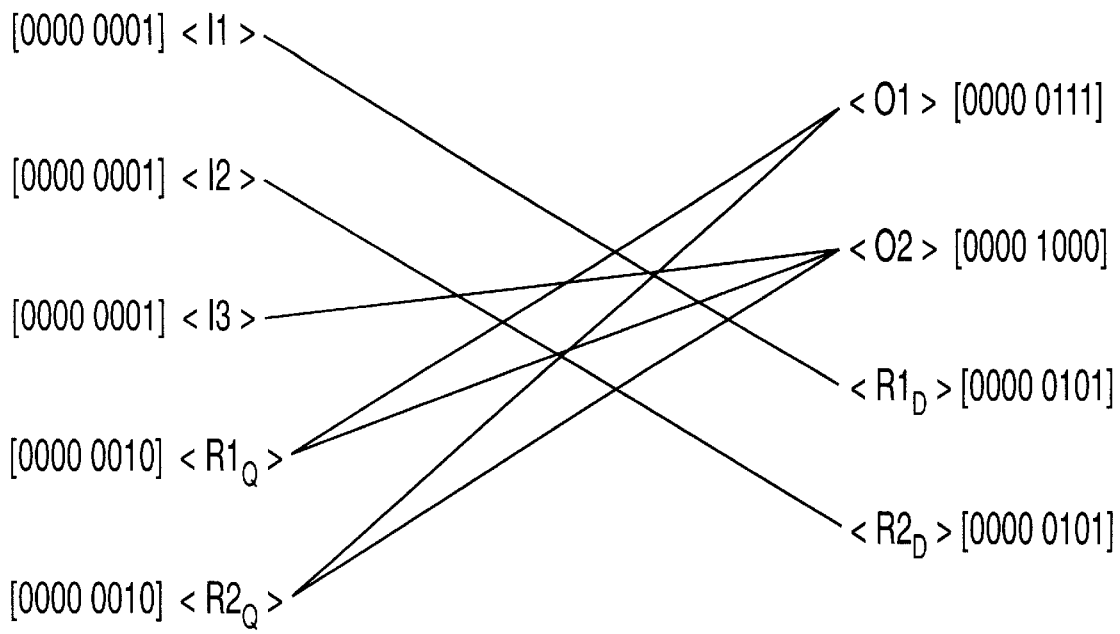
Figure 4C:
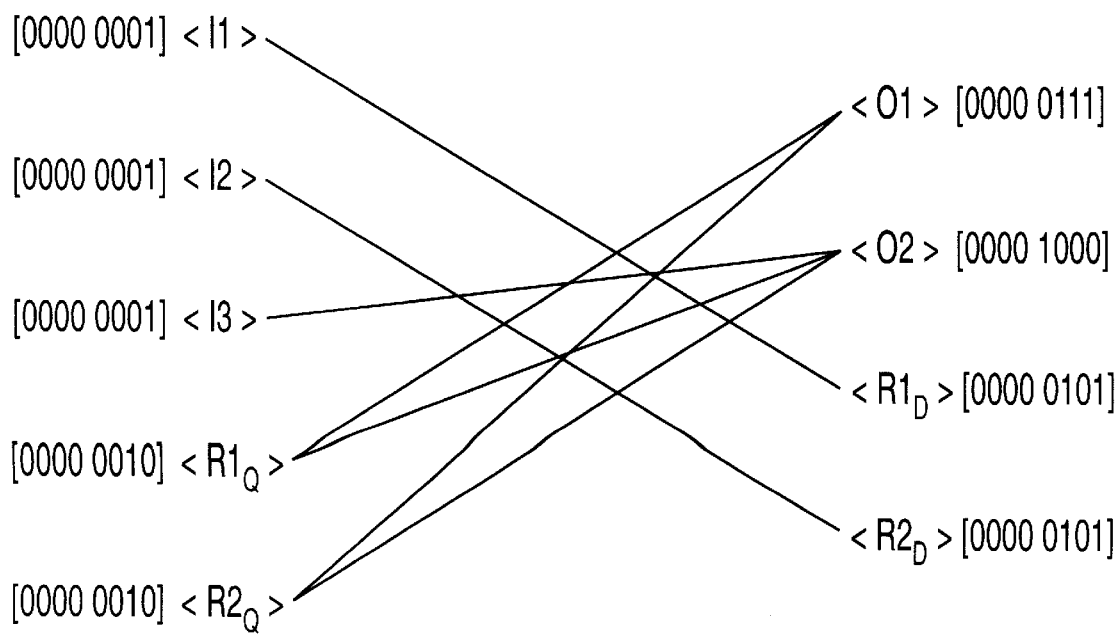

FIG. 4C depicts the results of applying the recoloring operation of Step 106 to the right side of each of the bipartite circuit representations. As discussed above, beginning with the right side is an arbitrary choice, since it is only necessary that alternation between circuit sides be accomplished for each iteration back to Step 106. As can be seen, for each of circuit1_simp.right and circuit2_simp.right, primary output O1 is assigned the sum of the following values: the value of 2 assigned to $R1_Q$, the value of 2 assigned to $R2^Q$, and the value of 3 previously assigned to O1. A similar sum is assigned to primary output O2, for both circuit1_simp.right and circuit2_simp.right. Register input $R1_D$ is assigned the sum of the following values: the value of 1 assigned to primary input I1 and the value of 4 previously assigned to $R1_D$. A similar sum is assigned to register input $R2_D$.

FIG. 4D shows the results of performing the insertion sort, of Step 107, to place in ascending order the nodes of each right-side set.

Figure 4E:
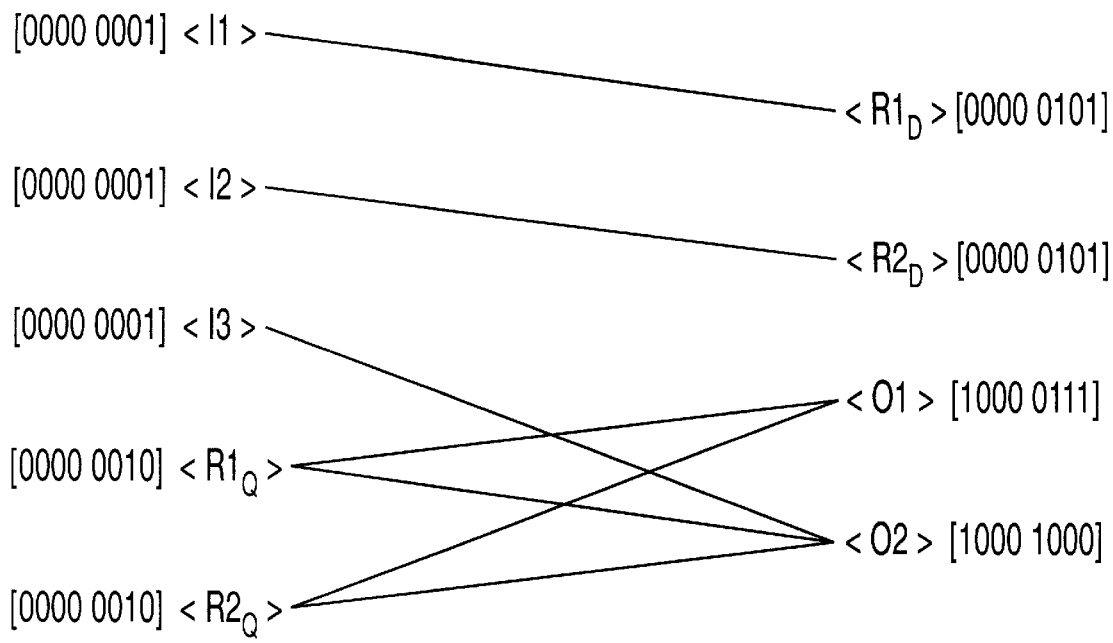
Figure 4E:
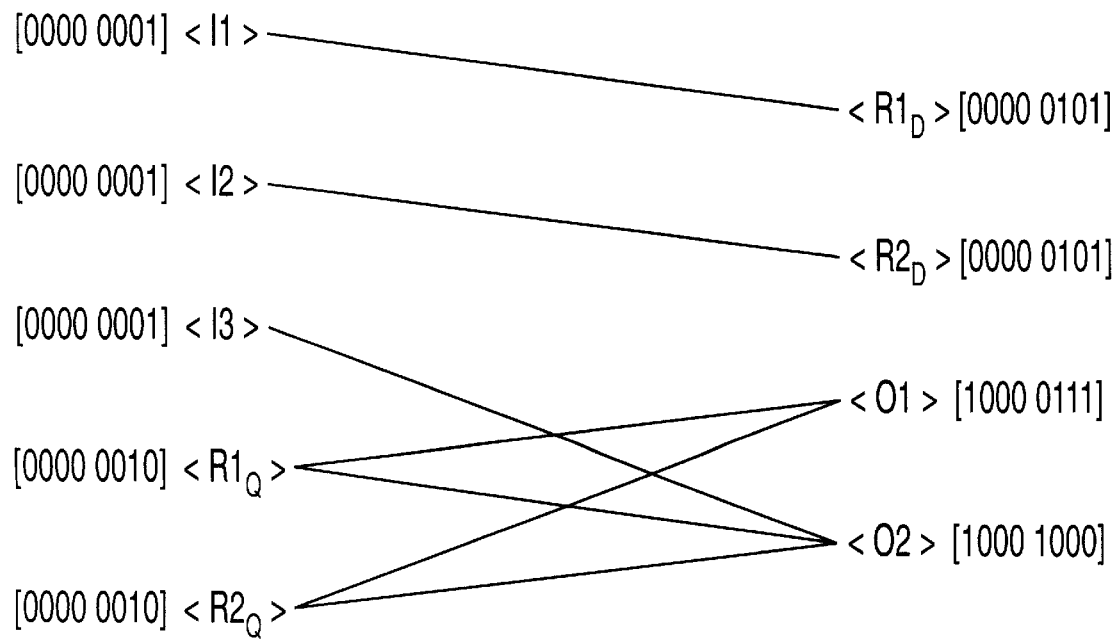

FIG. 4E depicts the results of accomplishing the consistency and progress checks of Step 108. As can be seen, two pairs of matched nodes were identified as part of the consistency checking procedure. The first pair is O1 of circuit1_simp.right and O1 of circuit2_simp.right. The second pair is O2 of circuit1_simp.right and O2 of circuit2_simp.right. The matched nodes are indicated by setting the highest order bits of their color words to one, while the same color that indicated the match is left in the lower-order bits. Alternatively, as discussed above, it may be desirable to change the original color indicating the match to another color which enhances further matching.

Performance of the progress checking procedure, upon FIG. 4E, proceeds as follows. Since all nodes, on both sides of both circuits, have not been matched, the "all-matched" progress indicator is not set. Since at least one new match has occurred in the recoloring just accomplished (in fact two matches have occurred), the "side-progress" progress indicator, for the right side, is set. Depending upon how the implementation of the progress checking procedure is accomplished, no further determination of conditions for possibly setting the "side-progress" progress indicator is necessary since it has already been set. However, for completeness of exposition, the results of determining the other conditions for possibly setting the (right side) "side-progress" progress indicator will now be presented. Since no new invalid nodes have been identified (in fact there are no invalid nodes at all), performance of this test will not cause a setting is of the right-side "side-progress" progress indicator. A current count of the maximal uniform groups, in either circuit1_simp.right or circuit2_simp.right of FIG. 4E, results in the number 1. Since this is the first time the right side of the circuits has been recolored, there is no last-time count of the maximal uniform groups of the right side. Assuming, however, that the last-time right-side maximal uniform group count is given a default value of zero, then the current count of 1 is greater, and the "side-progress" progress indicator, for the right side, is set.

Since the "all-matched" progress indicator is not set, the result of the query of Step 109 is negative and processing continues with Step 110. Since the right-side "side-progress" progress indicator is set, the procedure loops back to Step 106 for another recoloring operation.

Figure 4F:
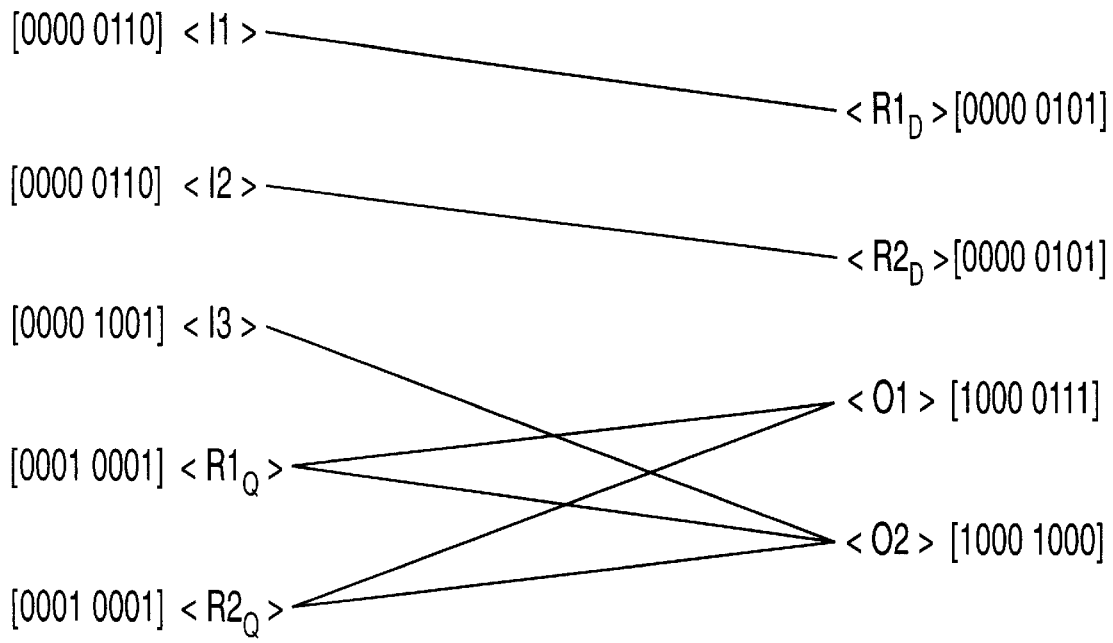
Figure 4F:
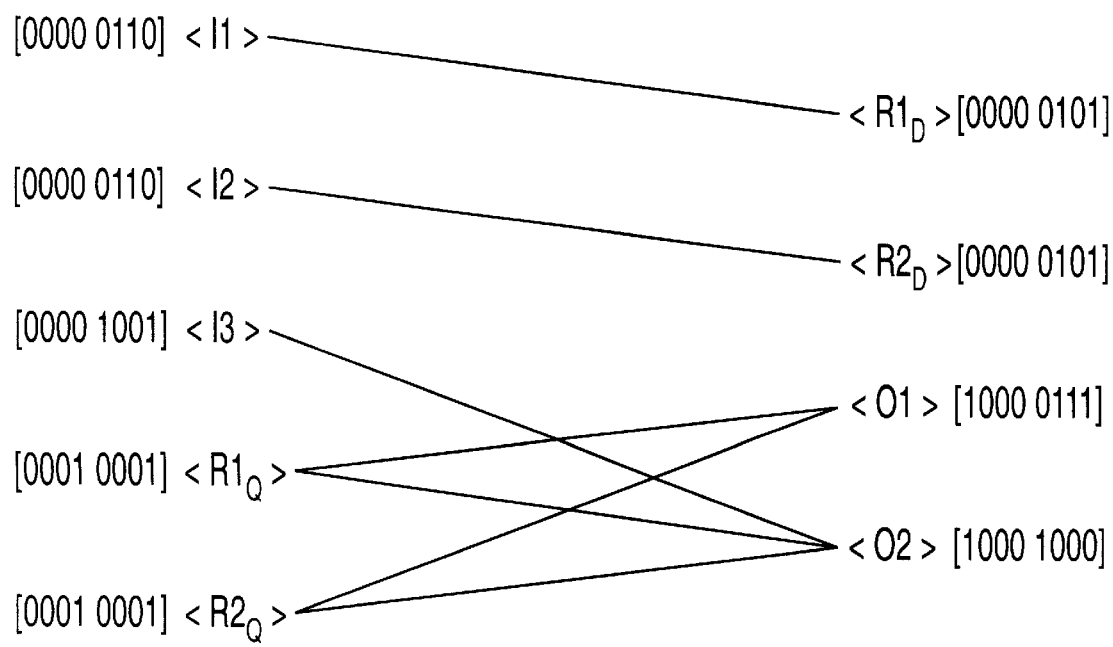

FIG. 4F shows the result of the next recoloring operation, of Step 106, now applied to the left sides of circuit1_simp and circuit2_simp.

A sort of the nodes of the left sides, in accordance with Step 107, does not change the ordering shown in FIG. 4F.

Figure 4G:
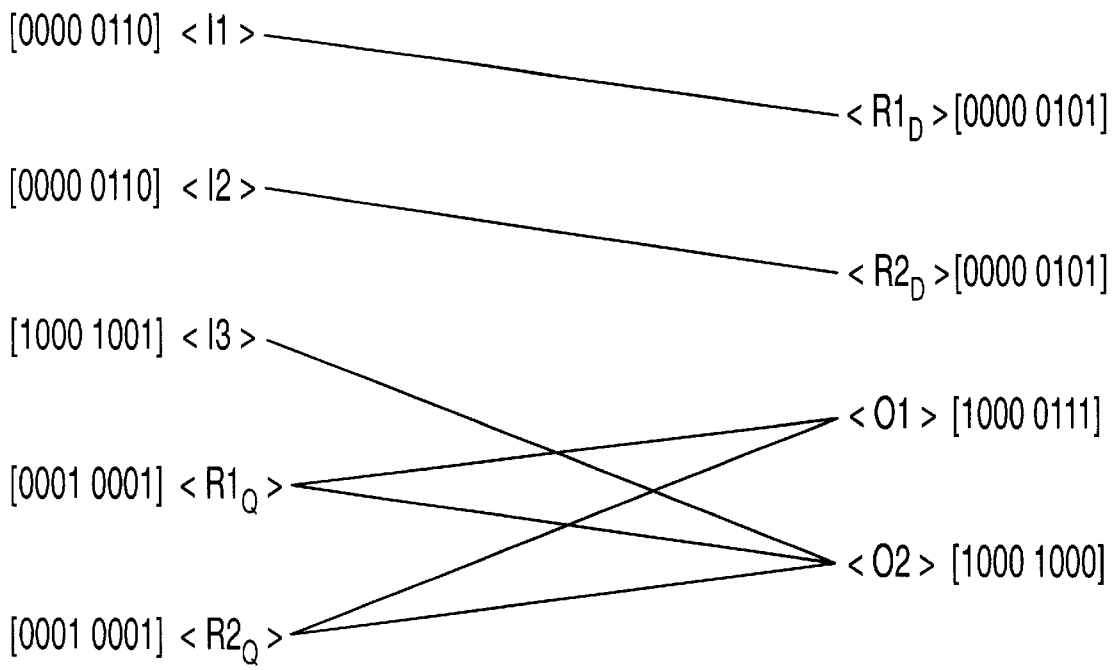
Figure 4G:
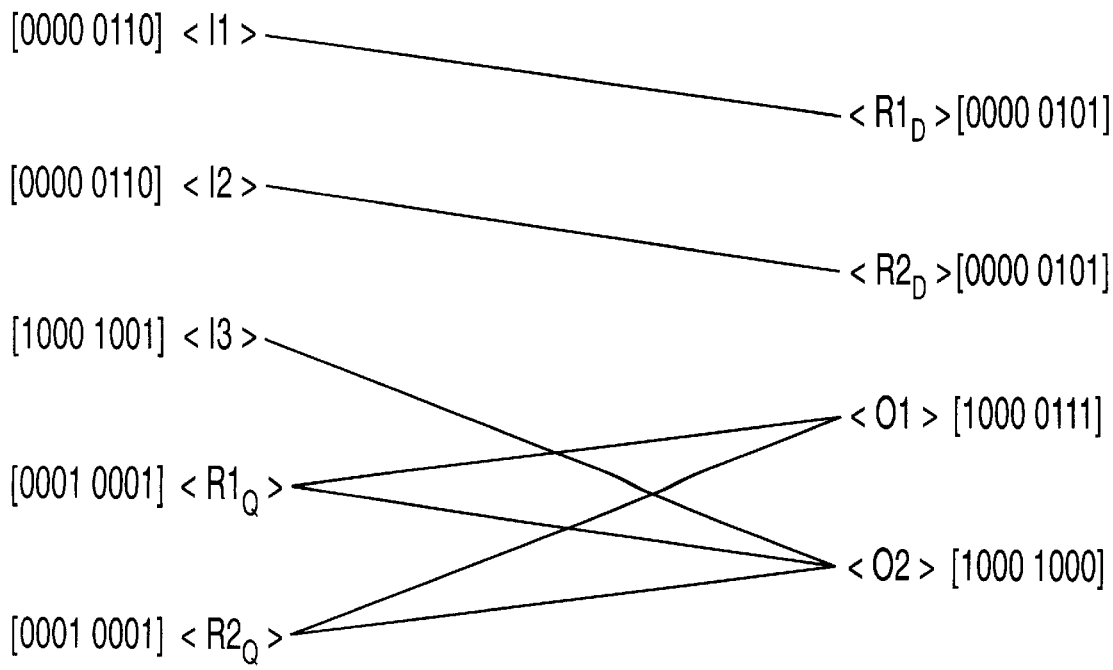

A consistency check on FIG. 4F, in accordance with Step 108, results in FIG. 4G, where just node 13 of both circuits is indicated as being matched. The other left side nodes remain the same. The progress checking procedure of Step 108 proceeds as follows. The "all matched" progress indicator is not set. Since one new match has been found, specifically the match for 13, the "side-progress" progress indicator (for the left side) is set. Since no new invalid nodes have been set, this condition does not cause the left-side "side-progress" progress indicator to be set. A current count of the maximal uniform groups, of either circuit1_simp.left or circuit2_simp.left, results in the number 2. Assuming a default last time maximal uniform group count of the left side as being zero, this condition does result in the "side-progress" progress indicator being set.

Figure 4H:
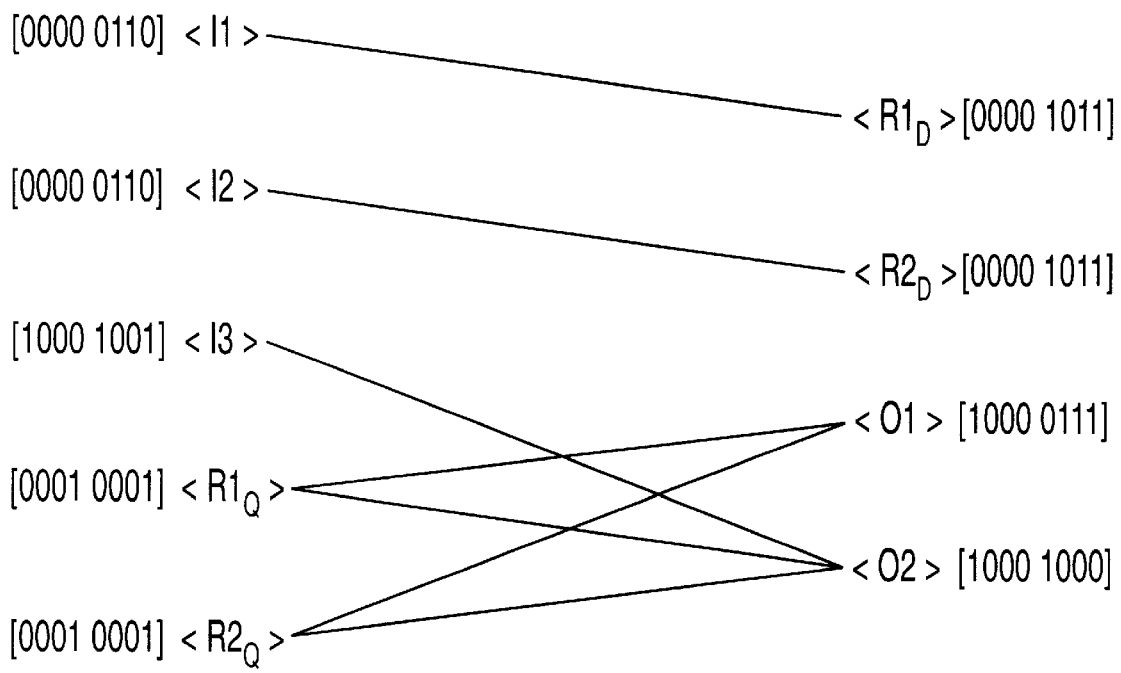
Figure 4H:
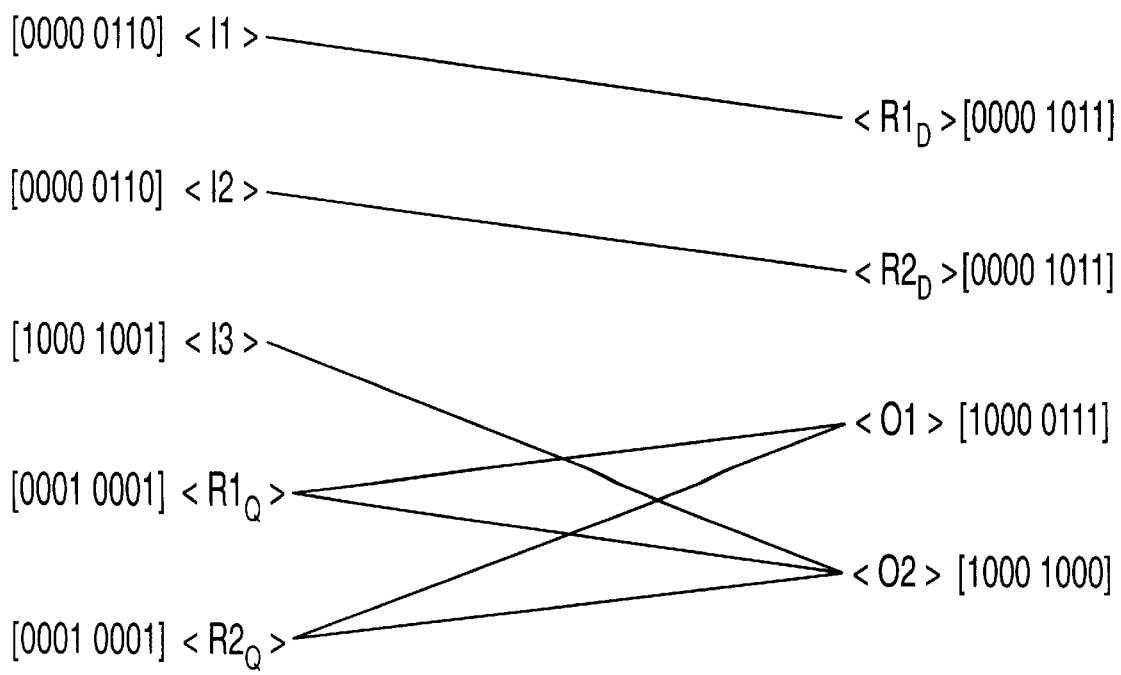

Since the "side-progress" progress indicator has been set, Step 110 causes the necessary correspondences procedure to loop back to Step 106 where the right circuit sides are recolored for the second time. The results of this second recoloring is shown in FIG. 4H. As can be seen, only nodes $R1_D$ and $R2_D$ are recolored since nodes O1 and O2 are already matched.

Performing the insertion sort of Step 107 on FIG. 4H results in no re-ordering of the nodes on the right sides.

Performing the consistency checks of Step 108 on FIG. 4H results in no new nodes being marked as matched or invalid on the right sides.

Performing the progress checks of Step 108 on FIG. 4H results in the following setting of the progress indicators. The "all-matched" progress indicator is not set. The "side-progress" progress indicator for the right side is not set since: i) no new matches have been identified, ii) no node of the right side has newly become invalid as a result of the just-performed consistency check and iii) a count of the maximal uniform groups of the right side is 1 which is the same number of maximal uniform groups counted the last time the right side was recolored and consistency checked.

The tests of Steps 109 and 110 are negative. The test of Step 111 is positive since the "side-progress" progress indicator of the left side was set the last time the left side was recolored.

Figure 4I:
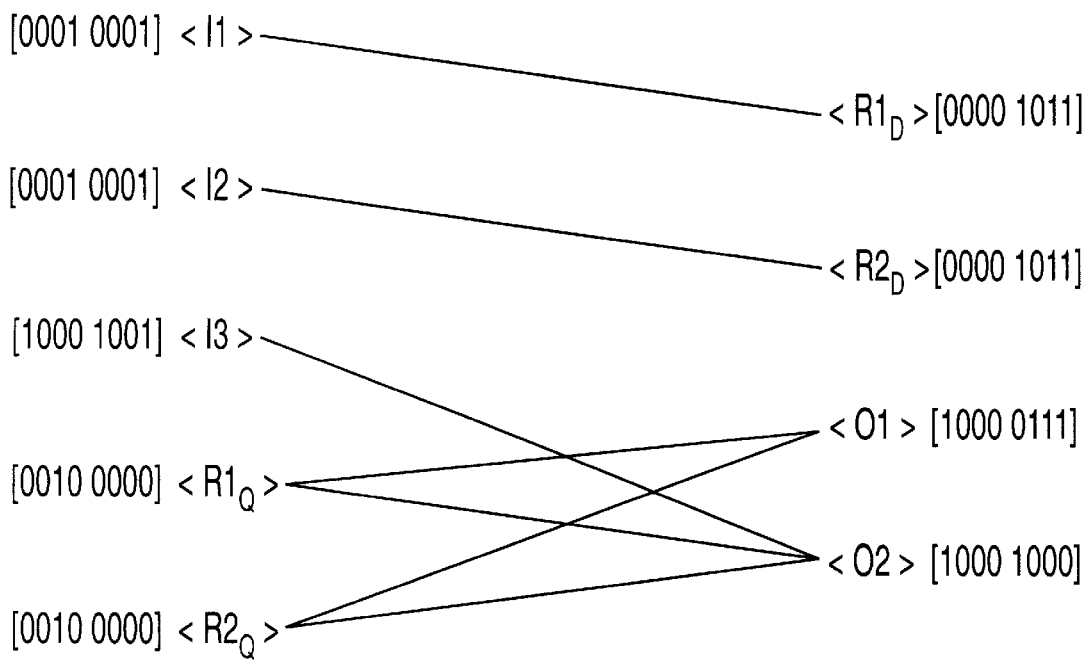
Figure 4I:
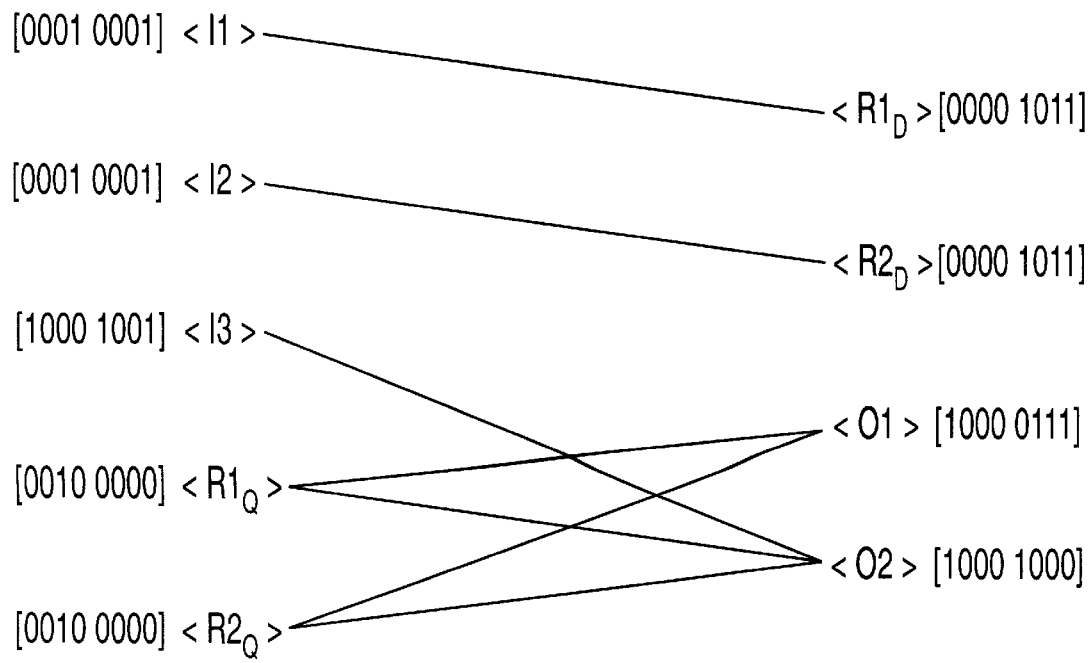

Performing Step 106 recolors the left sides of the circuits for the second time as shown in FIG. 4I. Note that just the lower order color-indicating bits of nodes O1 and O2 are used in determining the new colors for $R1_Q$ and $R2_Q$.

Figure 4J:
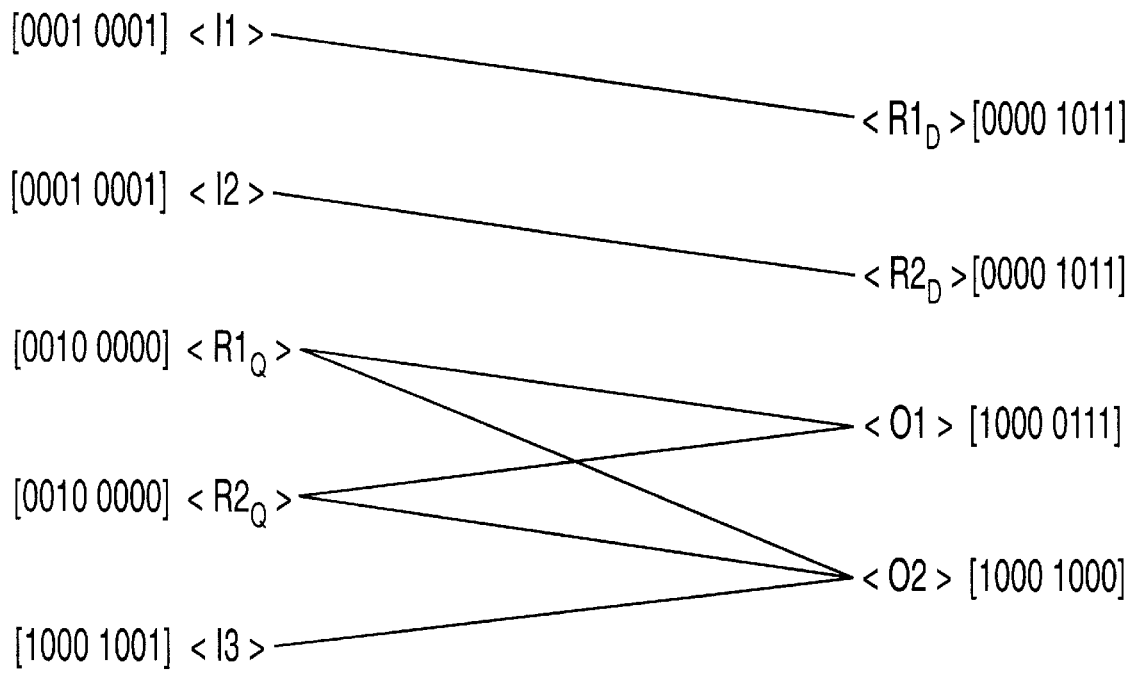
Figure 4J:
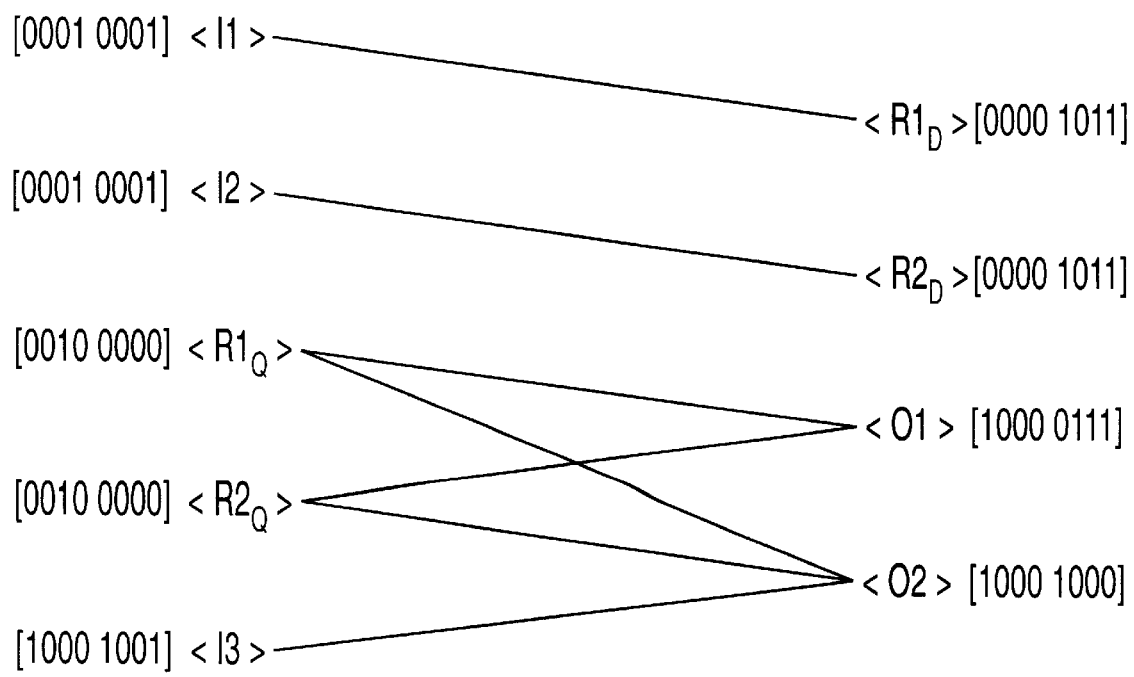

FIG. 4J depicts the results of insertion sorting the left sides of the circuits of FIG. 4I.

Performing the consistency checks of Step 108 on FIG. 4J results in no new nodes being marked as matched or invalid on the left sides.

Performing the progress checks of Step 108 on FIG. 4J results in the following setting of the progress indicators. The "all-matched" progress indicator is not set. The "side-progress" progress indicator for the left side is not set since: i) no node of the left side has newly become matched as a result of the just-performed consistency check, ii) no node of the left side has newly become invalid as a result of the just-performed consistency check and iii) a count of the maximal uniform groups of a left side is 2 which is the same number of maximal uniform groups counted the last time the left side was recolored and consistency checked.

The tests of Steps 109 and 110 are negative. The test of Step 111 is also negative since the "side-progress" progress indicator of the right side was also not set the last time the right side was recolored.

Therefore, the necessary correspondences procedure terminates. As can be seen from FIG. 4J, the necessary correspondences procedure terminates with 3 nodes matched for each circuit, out of a total of 9 nodes for each circuit.

HARDWARE ENVIRONMENT

Figure 5:
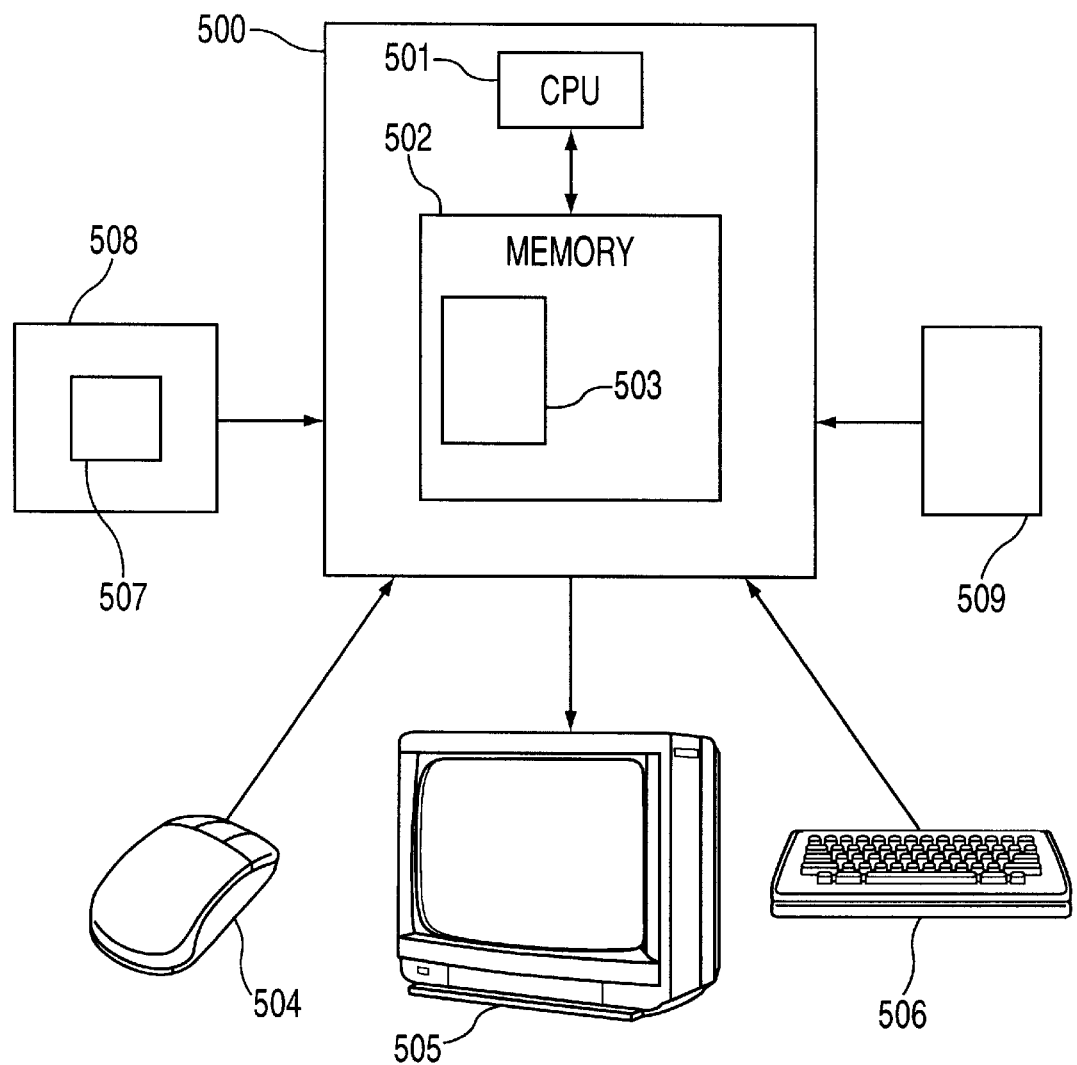
FIG. 5 depicts a hardware environment in which the present invention can be operated.

Typically, the verification architecture of the present invention is executed within the computing environment (or data processing system) such as that of FIG. 5. FIG. 5 depicts a workstation computer 500 comprising a Central Processing Unit (CPU) 501 (or other appropriate processor or processors) and a memory 502. Memory 502 has a portion of its memory in which is stored the software tools and data of the present invention. While memory 503 is depicted as a single region, those of ordinary skill in the art will appreciate that, in fact, such software may be distributed over several memory regions or several computers. Furthermore, depending upon the computer's memory organization (such as virtual memory), memory 502 may comprise several types of memory (including cache, random access memory, hard disk and networked file server). Computer 500 is typically equipped with a display monitor 505, a mouse pointing device 504 and a keyboard 506 to provide interactivity between the software of the present invention and the chip designer. Computer 500 also includes a way of reading computer readable instructions from a computer readable medium 507, via a medium reader 508, into the memory 502. Computer 500 also includes a way of reading computer readable instructions via the Internet (or other network) through network interface 509.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A method for matching circuit nodes, comprising:

identifying a first left set comprising a set of input nodes of a first combinational circuit;

identifying a first right set comprising a set of output nodes of the first combinational circuit;

identifying a second left set comprising a set of input nodes of a second combinational circuit;

identifying a second right set comprising a set of output nodes of the second combinational circuit;

generating an edge between a node of the first left set and a node of the first right set if there is at least one path between the two nodes through the first combinational circuit;

generating an edge between a node of the second left set and a node of the second right set if there is at least one path between the two nodes through the second combinational circuit;

assigning to each node of the first right set a value based upon information regarding the first combinational circuit;

assigning to each node of the first left set a value based upon information regarding the first combinational circuit;

assigning to each node of the second right set a value based upon information regarding the second combinational circuit;

assigning to each node of the second left set a value based upon information regarding the second combinational circuit;

assigning a value to a first node of the first right set that is a function of a value already assigned to the first node and a value assigned to each node of the first left set that is connected to by an edge to the first node;

assigning a value to a second node of the second right set that is a function of a value already assigned to the second node and a value assigned to each node of the second left set that is connected to by an edge to the second node; and assigning a value to at least one node of the first right set that is a function of the value assigned to each node of the first right set and the value assigned to each node of the second right set.

2. The method of claim 1, wherein the step of assigning a value to each node of the first right set further comprises assigning a first unique value identifying as a unique first right subset of the first right set of output nodes those nodes that are primary outputs of the first combinational circuit and the step of assigning a value to each node of the second right set further comprises assigning the same first unique value, identifying as a unique second right subset of the second right set of output nodes those nodes that are primary outputs of the second combinational circuit.

3. The method of claim 1, wherein the step of assigning a value to each node of the first right set further comprises assigning a first unique value identifying as a unique first right subset of the first right set of output nodes those nodes that are inputs to registers of the first combinational circuit and the step of assigning a value to each node of the second right set further comprises assigning the same first unique value, identifying as a unique second right subset of the second right set of output nodes those nodes that are inputs to registers of the second combinational circuit.

4. The method of claim 1, wherein the step of assigning a value to each node of the first left set further comprises assigning a first unique value identifying as a unique first left subset of the first left set of input nodes those nodes that are primary inputs of the first combinational circuit and the step of assigning a value to each node of the second left set further comprises assigning the same first unique value, identifying as a unique second left subset of the second left set of input nodes those nodes that are primary inputs of the second combinational circuit.

5. The method of claim 1, wherein the step of assigning a value to each node of the first left set further comprises assigning a first unique value identifying as a unique first left subset of the first left set of input nodes those nodes that are outputs of registers of the first combinational circuit and the step of assigning a value to each node of the second left set further comprises assigning the same first unique value, identifying as a unique second left subset of the second left set of input nodes those nodes that are outputs of registers of the second combinational circuit.

6. The method of claim 1, wherein the step of assigning a value to each node of the first right set further comprises assigning a first unique value identifying as a unique first right subset of the first right set of output nodes those nodes that are indicated by a designer of the first combinational circuit and the step of assigning a value to each node of the second right set further comprises assigning the same first unique value, identifying as a unique second right subset of the second right set of output nodes those nodes that are indicated by a designer of the second combinational circuit.

7. The method of claim 1, wherein the step of assigning a value to each node of the first left set further comprises assigning a first unique value identifying as a unique first left subset of the first left set of input nodes those nodes that are indicated by a designer of the first combinational circuit and the step of assigning a value to each node of the second left set further comprises assigning the same first unique value, identifying as a unique second left subset of the second left set of input nodes those nodes that are indicated by a designer of the second combinational circuit.

8. The method of claim 1, wherein the function of the step of assigning a value to a first node of the first right set is an arithmetic summation.

9. The method of claim 8, wherein prior to the arithmetic summation, a value assigned to a node of the first left set is first multiplied by a value assigned to an edge connecting the node of the first left set to the first node of the first right set.

10. The method of claim 8, wherein the arithmetic summation function treats each node assigned a value representing a clear color as having been assigned a value of zero.

11. The method of claim 1, wherein the function of the step of assigning a value to a first node of the first right set ignores the values assigned to each node of the first left set that are connected by an edge to the first node of the first right set, if the first node of the first right set is indicated as being a matched node.

12. The method of claim 1, wherein the function of the step of assigning a value to a first node of the first right set utilizes a color value and ignores a matched status value assigned to a node of the first left set that is connected by an edge to the first node of the first right set, if the node of the first left set is indicated as being a matched node.

13. The method of claim 1, wherein the function of the step of assigning a value to a first node of the first right set assigns an invalid value if at least one node inputting a value to the function has been assigned a value representing an invalid value.

14. The method of claim 1, wherein the function of the step of assigning a value to at least one node of the first right set assigns a matched value to a single unique node of the first right set if the single unique node has been assigned a unique value with respect to all other nodes of the first right set and the same unique value has been assigned to only a single node of the second right set.

15. The method of claim 14, further comprising the step of indicating a progress condition if a matched value is assigned.

16. The method of claim 1, wherein the function of the step of assigning a value to at least one node of the first right set assigns an invalid value to each node of a first group, of maximal size, of one or more nodes, all of a single unique color, of the first right set if a second maximal sized group of a same number of nodes as the first group, and all the nodes of the second group having the same single unique color as the first group, does not exist in the second right set.

17. The method of claim 15, further comprising the step of indicating a progress condition if an invalid value is assigned.

18. The method of claim 1, further comprising the step of indicating a termination condition if every node of the first left set, first right set, second left set and second right set is indicated as being matched.

19. The method of claim 1, further comprising the steps of:

counting a current first number of groups, of the first right set, of nodes of all the same unique color; and indicating a progress condition if the current first number is greater than an old first number indicating a number of groups, of the first right set, of nodes of all the same unique color.

20. The method of claim 19, wherein the old first number is a result of a previous iteration in which each node of the first right set is assigned a value as a function of a value already assigned to the node of the first right set and a value assigned to each node of the first left set that is connected by an edge to the node of the first left set.

21. The method of claim 1, wherein the steps of assigning a value based upon information regarding a combinational circuit are followed by a step of sorting, as individual sets, the nodes of the first left set, the first right set, the second left set and the second right set.

22. The method of claim 21, wherein the sort performed is a bin sort.

23. The method of claim 1, wherein the steps of assigning a value to a node of a right set that is a result of a function are followed by a step of sorting, as individual sets, the nodes of the first right set and the second right set.

24. The method of claim 23, wherein the sort performed is an insertion sort.

* * * * *